US012375067B2

(12) United States Patent
Tsai et al.

(10) Patent No.: US 12,375,067 B2
(45) Date of Patent: Jul. 29, 2025

(54) CIRCUIT AND METHOD FOR DUTY CYCLE ADJUSTMENT

(71) Applicant: TAIWAN SEMICONDUCTOR MANUFACTURING COMPANY LTD., Hsinchu (TW)

(72) Inventors: Tsung-Hsien Tsai, Taoyuan (TW); Chih-Hsien Chang, New Taipei (TW); Ya-Tin Chang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 76 days.

(21) Appl. No.: 18/510,696

(22) Filed: Nov. 16, 2023

(65) Prior Publication Data

US 2025/0167770 A1    May 22, 2025

(51) Int. Cl.
*H03K 3/017* (2006.01)
*H03K 5/133* (2014.01)
*H03L 7/081* (2006.01)

(52) U.S. Cl.
CPC ............. *H03K 3/017* (2013.01); *H03K 5/133* (2013.01); *H03L 7/0814* (2013.01)

(58) Field of Classification Search
None
See application file for complete search history.

(56) References Cited

U.S. PATENT DOCUMENTS

| 10,911,165 | B1 * | 2/2021 | Albel | H04B 17/21 |
| 11,387,813 | B2 * | 7/2022 | Ting | H03K 5/1565 |
| 2021/0270879 | A1 | 9/2021 | Tsai et al. | |

* cited by examiner

*Primary Examiner* — Cassandra F Cox
(74) *Attorney, Agent, or Firm* — WPAT LAW; Anthony King (57) ABSTRACT

A circuit and a method for adjusting a periodic input signal are provided. The circuit includes a duty cycle calibration (DCC) device, a phase adjusting device, and a duty cycle measurement (DCM) device. The DCC device is configured to generate a first signal and a second signal in response to the periodic input signal. The first signal and the second signal have different phases. The phase adjusting device is configured to receive the first signal and the second signal to generate a third signal by combining the first signal and the second signal based on a selection signal. The DCM device is configured to measure and adjust a duty cycle of the third signal so that the selection signal is adjusted to generate a periodic output signal. A frequency of the periodic output signal is twice that of the periodic input signal.

20 Claims, 6 Drawing Sheets

CIRCUIT AND METHOD FOR DUTY CYCLE ADJUSTMENT

BACKGROUND

The present disclosure relates, in general, to semiconductor circuits and methods for adjusting the duty cycle of the signal.

Phase-locked loop (PLL) circuits are widely used in various applications such as clock distribution. More than two PLL circuits can be cascaded to increase the frequency of the reference clock signal. However, unqualified jitter may occur. Also, dedicated power supplies and bumps utilized to drive the cascaded PLL circuits will increase power consumption.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90° or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
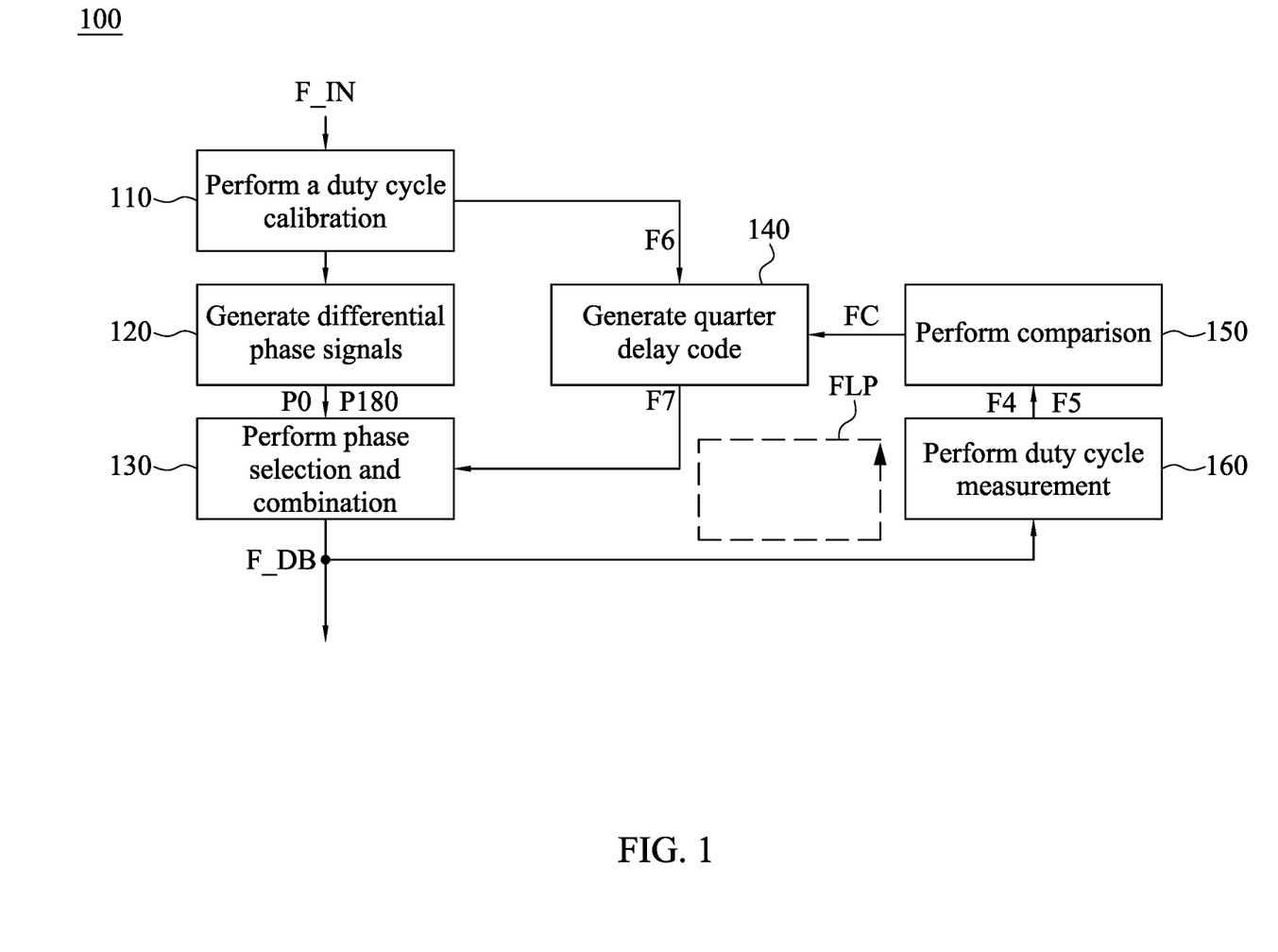
FIG. 1 is a schematic view illustrating a method 100 for adjusting duty cycle of a period input signal, in accordance with some embodiments of the present disclosure.

FIG. 1 is a schematic view illustrating a method 100 for adjusting duty cycle of a period input signal, in accordance with some embodiments of the present disclosure. The method 100 can be performed or executed by a processor or a controller. The controller may include, but is not limited to, a central processing unit (CPU), a microprocessor, an application-specific instruction set processor (ASIP), a Field Programmable Gate Array (FPGA), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor, or the like. The method 100 can be performed or executed by, for example, the circuit 200 of FIG. 2 or the system 300 of FIG. 3.

The method 100 includes operations 110, 120, 130, 140, 150, and 160. In operation 110, a periodic input signal F_IN is received to perform a duty cycle calibration. In some embodiments, at least one duty-cycle-calibration (DCC) device can be used to receive the periodic input signal F_IN and execute the duty cycle calibration to generate a signal F6. The signal F6 will be utilized in the operation 140 to generate a quarter delay code. Duty cycle refers to the percentage of time that a periodic digital signal exhibits a high logic value during a full signal cycle or period. For example, a signal that exhibits the high logic value for 50% of the signal period has a 50% duty cycle. Similarly, for instance, a signal that exhibits the high logic value for 40% of a signal period has a 40% duty cycle. The signal F6 can include a digital signal indicating a quarter period of the periodic input signal F_IN.

In operation 120, two differential phase signals P0 and P180 are generated by the DCC device in response to the periodic input signal F_IN. In some embodiments, the differential phase signals P0 and P180 have the same period. In some embodiments, the differential phase signals P0 and P180 have the same frequency. In some embodiments, the differential phase signals P0 and P180 have different phases. In some embodiments, the differential phase signals P0 and P180 have opposite phases. In some embodiments, the differential phase signals P0 and P180 have a phase difference of 180°. In some embodiments, the differential phase signal P0 is at a high logic value while the differential phase signal P180 is at a low logic value, and the differential phase signal P0 is at a low logic value while the differential phase signal P180 is at a high logic value.

In operation 130, the differential phase signals P0 and P180 are received by a phase adjusting device to perform the phase selection and combination. In some embodiments, the phase adjusting device can be used to execute the phase selection and combination for the differential phase signals P0 and P180 corresponding to the signal F7. The signal F_DB can be generated based on the phase selection and combination. In some embodiments, the frequency of the signal F_DB is twice that of the periodic input signal F_IN. In some embodiments, the frequency of the signal F_DB is twice those of the differential phase signals P0 and P180.

In operation 140, a quarter delay code is generated by combining the signal F6 from the operation 110 and the signal FC from the operation 150. In some embodiments, the quarter delay code is generated by a code generator to control the phase selection and combination of the operation 130. The quarter delay code can be included by the signal F7.

In operation 150, a comparison is performed to generate a signal FC by a duty cycle measurement (DCM) device. In some embodiments, the DCM device receives and compares two signals F4 and F5 in order to create the signal FC accordingly. In some embodiments, the signal F4 indicates half of a period of the signal F_DB. In some embodiments, the signal F5 indicates a duration in which the signal F_DB is at a high logic value.

In operation 160, the duty cycle measurement is performed by the DCM device to generate the signals F4 and F5. In some embodiments, the DCM device receives the signal F_DB and measure the duty cycle of the signal F_DB. In some embodiments, the DCM device extracts the signals F4 and F5 according the measurement of the duty cycle of the signal F_DB.

In some embodiments, the method can include a feedback loop FLP. In some embodiments, the feedback loop FLP is developed among the operations 130, 140, 150 and 160. The feedback loop FLP can be executed in the sequence of the operations 130, 160, 150 and 140 repeatedly. In some embodiments, the feedback loop FLP is created to adjust or optimize the duty cycle of the signal F_DB. In some embodiments, the feedback loop FLP is performed until the duty cycle of the signal F_DB is approximately 50% to obtain a periodic output signal.

Figure 2:
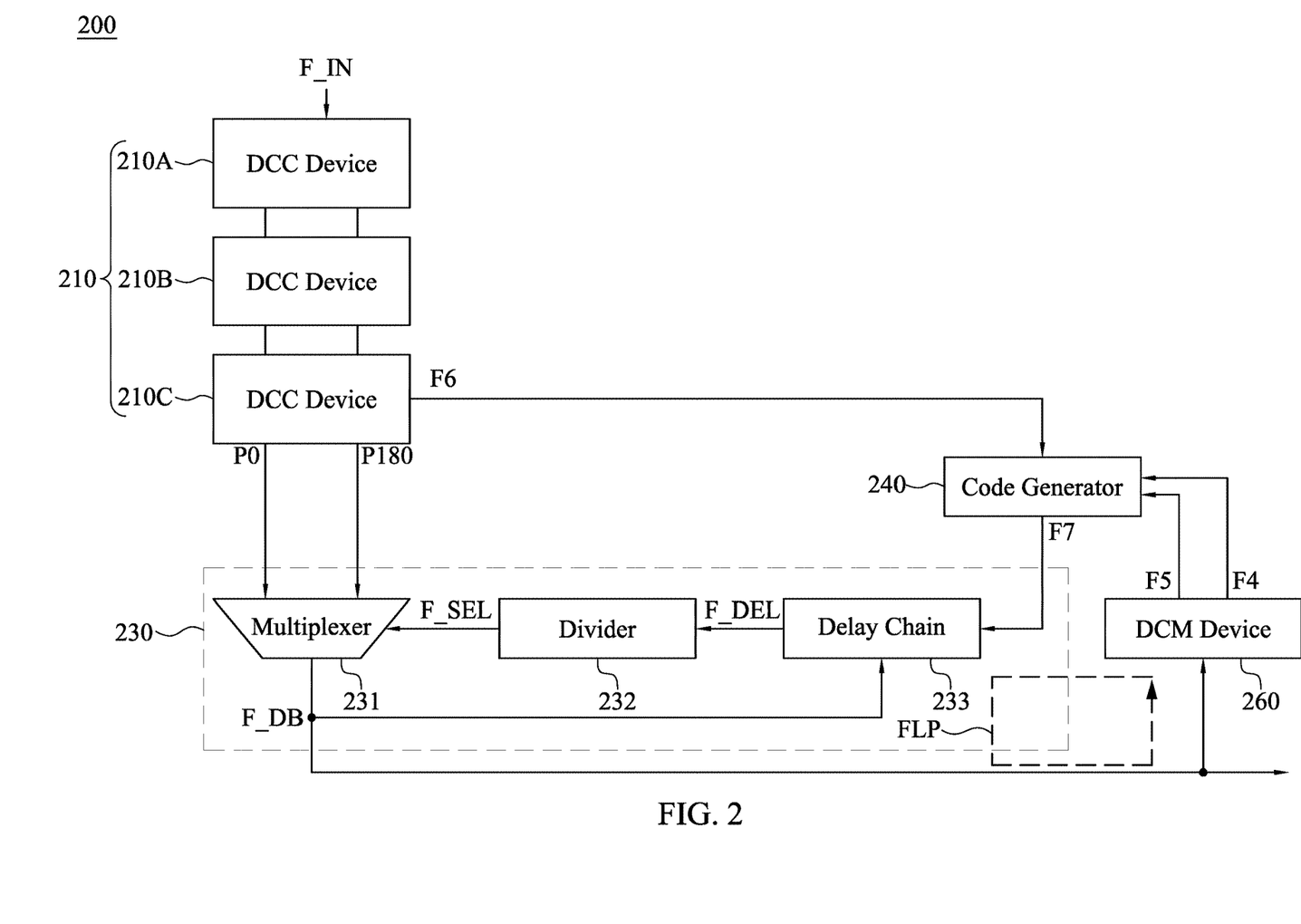
FIG. 2 is a schematic view illustrating a circuit for adjusting duty cycle of a period input signal, in accordance with some embodiments of the present disclosure.

FIG. 2 is a schematic view illustrating a circuit 200 for adjusting a duty cycle of a period input signal F_IN, in accordance with some embodiments of the present disclosure. The circuit 200 of FIG. 2 can be a physical implementation corresponding to the method 100 of FIG. 1. The circuit 200 of FIG. 2 can be used to execute the method 100 of FIG. 1.

In some embodiments, the circuit 200 includes several DCC devices 210, a phase adjusting device 230, a code generator 240 and a DCM device 260. The phase adjusting device 230 is electrically coupled between the DCC devices 210, the code generator 240 and the DCM device 260. In some embodiments, the phase adjusting device 230 can include a multiplexer 231, a divider 232, and a delay chain 233.

Each of the DCC device 210, the multiplexer 231, the divider 232, the delay chain 233, the code generator 240 and the DCM device 260 can include or can be formed by transistors, resistors, capacitors, and/or diodes. In some embodiments, forming a transistor includes forming one or more logical or functional circuits. In some embodiments, forming a transistor includes forming one or more active areas, source/drain (S/D) structures, isolation structures, gate structures, or the like. In some embodiments, forming a transistor includes performing one or more implantation processes in areas of a semiconductor substrate corresponding to active areas, whereby predetermined doping concentrations and types are achieved for one or more given dopants. In some embodiments, forming a transistor includes performing one or more of lithography, deposition, etching, planarizing, or other suitable processes.

Any two of the DCC devices 210, the multiplexer 20, the divider 232, the delay chain 233, the code generator 240 and the DCM device can be electrically connected. In some embodiments, constructing the electrical connection includes constructing one or more conductive segments at one or more of the first, second, or other elevations and/or constructing one or more vias between various elevations. In some embodiments, constructing the electrical connection includes constructing one or more electrical connections between one or more reference voltage paths configured to carry one or both of power supply voltages.

In some embodiments, the circuit 200 includes a plurality of DCC devices 210, for example, three stages of DCC devices 210A, 210B and 210C as illustrated in FIG. 2. In some embodiments, the DCC device 210C, the last stage of the DCC devices 210A to 210C, is configured to transmit the signal F6 to the code generator 240. The signal F6 is indicative of a quarter of a period of the periodic input signal F_IN.

In some embodiments, one stage of DCC device may be unable to cover or adjust 5% duty cycle distortion of the periodic input signal F_IN. In some embodiments, multiple stages or multiple numbers of DCC devices can be included by the circuit 200 to cover the duty cycle distortion of full period of the periodic input signal F_IN for generating the differential phase signals P0 and P180 with accurate duty cycles. That is, the circuit 200 may include more than three stages of DCC devices. In some embodiments, the frequency of the differential phase signals P0 and P180 can be greater than that of the periodic input signal F_IN. In some embodiments, the frequency of the differential phase signals P0 and P180 can be smaller than the frequency of the periodic input signal F_IN. In some embodiments, the frequency of the differential phase signals P0 and P180 can be substantially identical to the frequency of the periodic input signal F_IN. In some embodiments, the duty cycle of the differential phase signals P0 and P180 can exceed that of the periodic input signal F_IN. In some embodiments, the duty cycle of the differential phase signals P0 and P180 can be lower than the duty cycle of the periodic input signal F_IN. In some embodiments, the duty cycle of the differential phase signals P0 and P180 can be substantially identical to the duty cycle of the periodic input signal F_IN.

In some embodiments, the phase adjusting device 230 can include a multiplexer 230, a divider 232 and a delay chain 233. The multiplexer 230 is configured to receive the differential phase signals P0 and 180, and generate the signal F_DB according to a selection signal F_SEL. In some embodiments, the signal F_DB is generated by synthesizing the differential phase signals P0 and P180 in accordance with the selection signal F_SEL. In some embodiments, the frequency of the signal F_DB is greater than that of differential phase signals P0 and P180. In some embodiments, the frequency of the signal F_DB is twice that of differential phase signals P0 and P180. In some embodiments, the signal F_DB is transmitted to the delay chain 233 and the DCM device 260 respectively.

In some embodiments, the DCM device 260 is configured to receive the signal F_DB and measure the duty cycle of the signal F_DB. In some embodiments, the DCM device 260 generates the signals F4 and F5 based on the measurement of the duty cycle of the signal F_DB. The DCM device 260 transmits the signals F4 and F5 to the code generator 240. In some embodiments, the signal F4 indicates half of a period of the signal F_DB. In some embodiments, the signal F5 indicates a duration in which the signal F_DB is at a high logic value. In some embodiments, the signals F4 and F5 of the DCM device 260 are used to adjust or regulate the duty cycle of the signal F_DB, so that the duty cycle of the signal F_DB can approximate 50%.

In some embodiments, the code generator 240 is configured to generate the signal F7 in accordance with the signals F4 and F5 from the DCM device 260. The code generator 240 is configured to generate the signal F7 in accordance with the signal F6 from the DCC device 210C. The signal F7 is transmitted from the code generator 240 to the delay chain 233 of the phase adjusting device 230. In some embodiments, the signal F7 of the code generator 240 is used to adjust or regulate the duty cycle of the signal F_DB, so that the duty cycle of the signal F_DB can approximate 50%.

In some embodiments, as shown in FIG. 2, the delay chain 233 is electrically coupled between the code generator 240 and the divider 232. The delay chain 233 is configured to receive the signal F7 and the signal F_DB. The delay chain 233 is configured to generate the signal F_DEL in response to the signals F7 and F_DB. In some embodiments, the delay chain 233 can include various types of delay elements or logic gates to delay at least one edge between different logic values of the signal F7.

In some embodiments, the divider 232 is electrically coupled between the delay chain 233 and the multiplexer 231. The divider 232 is configured to receive the signal F_DEL from the delay chain 233 and generate the selection signal F_SEL accordingly. In some embodiments, the divider 232 can be used to divide the frequency of the signal F_DEL to create the selection signal F_SEL. In some embodiments, the frequency of the selection signal F_SEL is different from the frequency of the signal F_DEL. In some embodiments, the frequency of the selection signal F_SEL is substantially half of the frequency of the signal F_DEL.

In some embodiments, the feedback loop FLP is performed or operated by the multiplexer 231, the divider 232, the delay chain 233, the code generator 240 and the DCM device 260. In some embodiments, the feedback loop FLP is executed repeatedly to regulate or optimize the duty cycle of the signal F_DB. In some embodiments, the feedback loop FLP is performed until the duty cycle of the signal F_DB is approximately 50% to obtain a periodic output signal.

In some embodiments, the circuit 200 can be of all-digital design, without dedicated power supply or power bumps utilized, so as to reduce power consumption. In some embodiments, large resistors and large capacitors are not required and the overall area of the chip can be decreased. In some embodiments, compared to the cascaded PLL circuit, the circuit 200 can reduce jitter and increase the upper limit of bandwidth.

Figure 3:
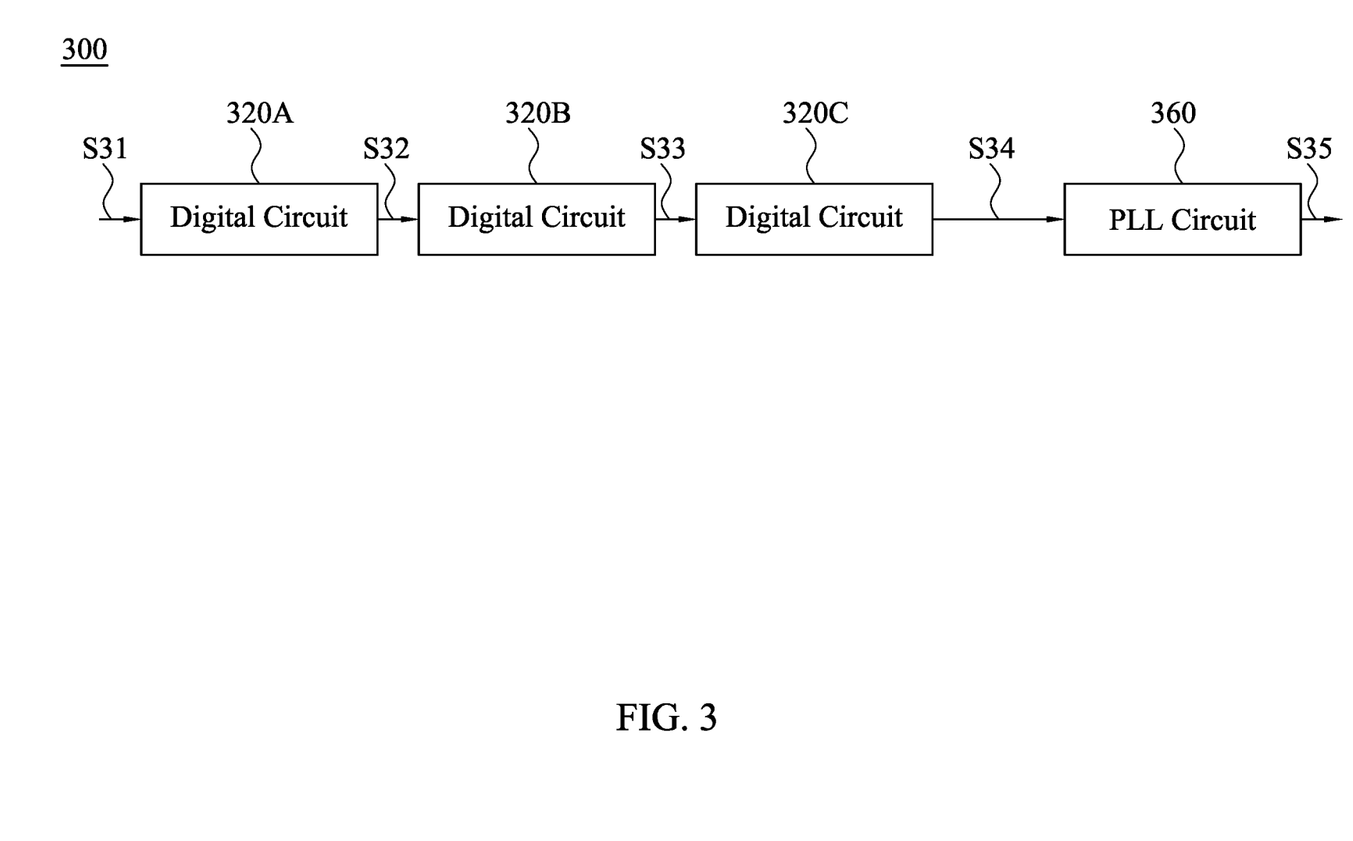
FIG. 3 is a schematic view illustrating a system for adjusting duty cycle of a period input signal, in accordance with some embodiments of the present disclosure.

FIG. 3 is a schematic view illustrating a system 300 for adjusting the duty cycle of the period input signal F_IN, in accordance with some embodiments of the present disclosure. The system 300 can include multiple stages of digital circuits 320A, 320B, 320C and a PLL (phase-locked loop) circuit 360.

In some embodiments, each of the digital circuits 320A, 320B, 320C can include or correspond to the circuit 200 of FIG. 2. The digital circuits 320A, 320B, 320C can be used to double the frequency of the input signal with a duty cycle of around 50%. For example, the signal S31 input to the digital circuit 320A has a frequency of 10 MHz. The signal S32 output from the digital circuit 320A and input to the digital circuit 320B has a frequency of 20 MHz, double the frequency of 10 MHz. The signal S33 output from the digital circuit 320B and input to the digital circuit 320C has a frequency of 40 MHz, double the frequency of 20 MHz. The signal S34 output from the digital circuit 320C and input to the PLL circuit 360 has a frequency of 80 MHz, double the frequency of 40 MHz. The PLL circuit 360 receives the signal S34 as the reference clock signal, and generates the signal S35 accordingly having a greater frequency. In some embodiments, the PLL circuit 360 can generate the signal S35 having frequency up to 3 GHz.

By utilizing the digital circuits 320A to 320C, the reference clock signal can be increased or extended, and thus the upper limit of the bandwidth of the PLL circuit 360 can be increased. Compared to conventional approaches of arranging a preliminary PLL circuit before the PLL circuit 360, no dedicated power supplies and power bumps is required for driving the digital circuits 320A to 320C. In some embodiments, unqualified jitter in phase, frequency or voltage can also be reduced. In some embodiments, large resistors and large capacitors are not required. Therefore, the digital circuits 320A to 320C can at least provide the benefit of reducing power consumption, decreasing overall area, improving jitter and increasing the upper limit of the bandwidth of the PLL circuit.

Figure 4A:
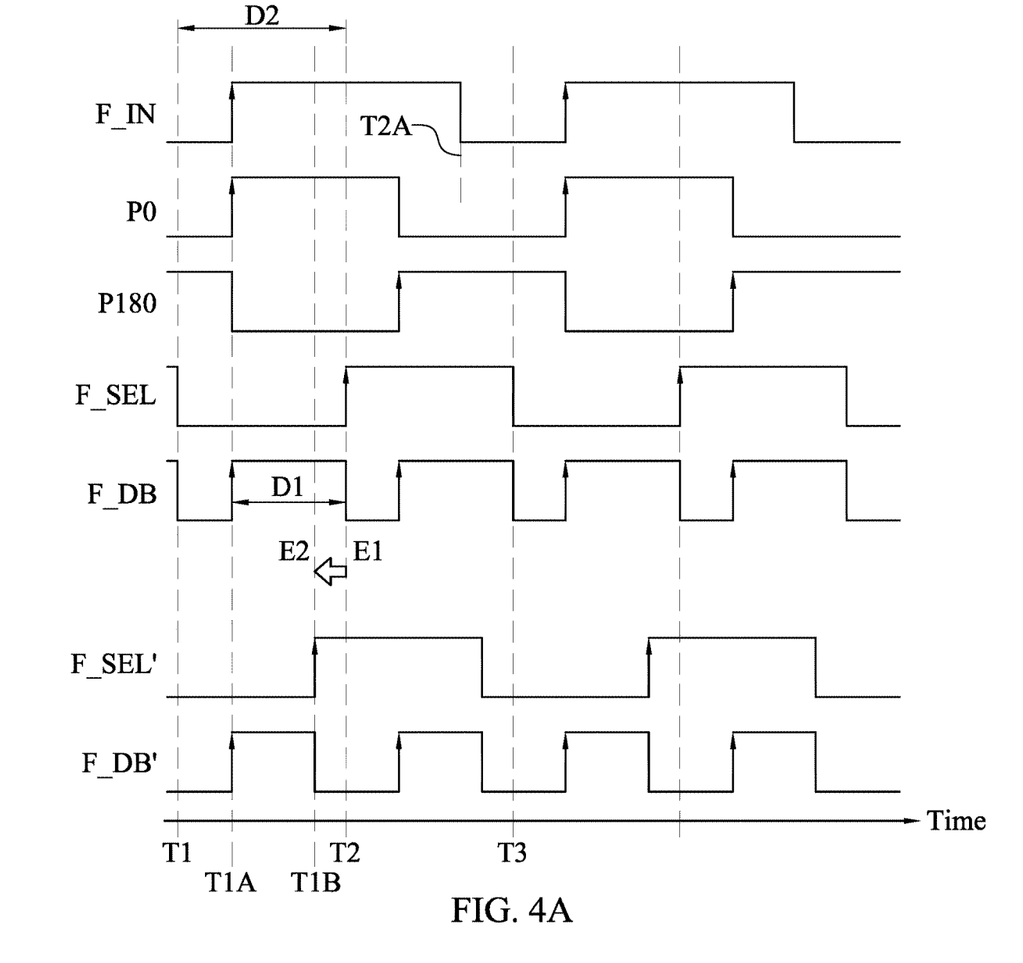
FIG. 4A is a schematic view illustrating waveforms representative of advancing an edge of a signal to adjust duty cycle, in accordance with some embodiments of the present disclosure.

FIG. 4A is a schematic view illustrating waveforms representative of advancing an edge E1 of the selection signal F_SEL to adjust duty cycle, in accordance with some embodiments of the present disclosure.

In some embodiments, the input periodic signal F_IN switches from low logic value to high logic value at time T1A, and switches from high logic value to low logic value at time T2A. In some embodiments, the differential phase signals P0 and P180 are generated in according to the input periodic signal F_IN. The differential phase signals P0 and P180 have a duty cycle of around 50%. The differential phase signals P0 and P180 have opposite phases. In some embodiments, the differential phase signal P0 switches from low logic value to high logic value at time T1A, which is identical to the corresponding portion of the periodic input signal F_IN. In some embodiments, the differential phase signal P180 switches from high logic value to low logic value at time T1A, which is opposite to the corresponding portion of the periodic input signal F_IN and the differential phase signal P0.

In some embodiments, the differential phase signals P0 and P180 are extracted from the periodic input signal F_IN to generate the signal F_DB according to the selection signal F_SEL. When the selection signal F_SEL is at low logic value in a duration between time T1 and time T2, the corresponding portion of the differential phase signal P0 between time T1 and time T2 is extracted to become the corresponding portion of the signal F_DB between time T1 and time T2. When the selection signal F_SEL is at high logic value in a duration between time T2 and time T3, the corresponding portion of the differential phase signal P180 between time T2 and time T3 is extracted to become the corresponding portion of the signal F_DB between time T2 and time T3. In some embodiments, the signal F_DB is created by combining or synthesizing the differential phase signals P0 and P180.

In some embodiments, as shown in FIG. 4A, the duty cycle of the signal F_DB is greater than 50%. In some embodiments, the duration D1 in which the regarding the signal F_DB is at high logic value is greater than half of the period D2 of the signal F_DB. The duration D1 in which the signal F_DB is at high logic value can be indicated or included by the signal F5 of FIG. 1 and FIG. 2. Furthermore, half of the period D2 of the signal F_DB can be indicated or included by the signal F4 of FIG. 1 and FIG. 2. In some embodiments, in response to the signal F4 is smaller than the signal F5 in amplitude, the selection signal is shifted or moved forward by the phase adjusting device 230 and the DCM device 260 to decrease the duty cycle of the selection signal F_SEL.

In some embodiments, the edge E1 of the selection signal F_SEL, representing the transition between low logic value and high logic value, is advanced or moved forward to the edge E2 to generate another selection signal F_SEL'. In some embodiments, the selection signal F_SEL' switches from a low logic value to a high logic value at time T1B, which is earlier than the time T2 at which the selection signal F_SEL switches from a low logic value to a high logic value. The time T1B can be different from the time T1A. The time T1B can be later than the time T1A. In some embodiments, the selection signal F_SEL' switches from a low logic value to a high logic value at the edge E2, which is advanced to the edge E1 at which the selection signal F_SEL switches from a low logic value to a high logic value. In some embodiments, another signal F_DB' can be generated by combining the differential phase signals P0 and P180 corresponding to the selection signal F_SEL'. In some embodiments, the duty cycle of the signal F_DB' is smaller than the duty cycle of the signal F_DB. In some embodiments, the duty cycle of the signal F_DB' is adjusted to approximate 50%.

Figure 4B:
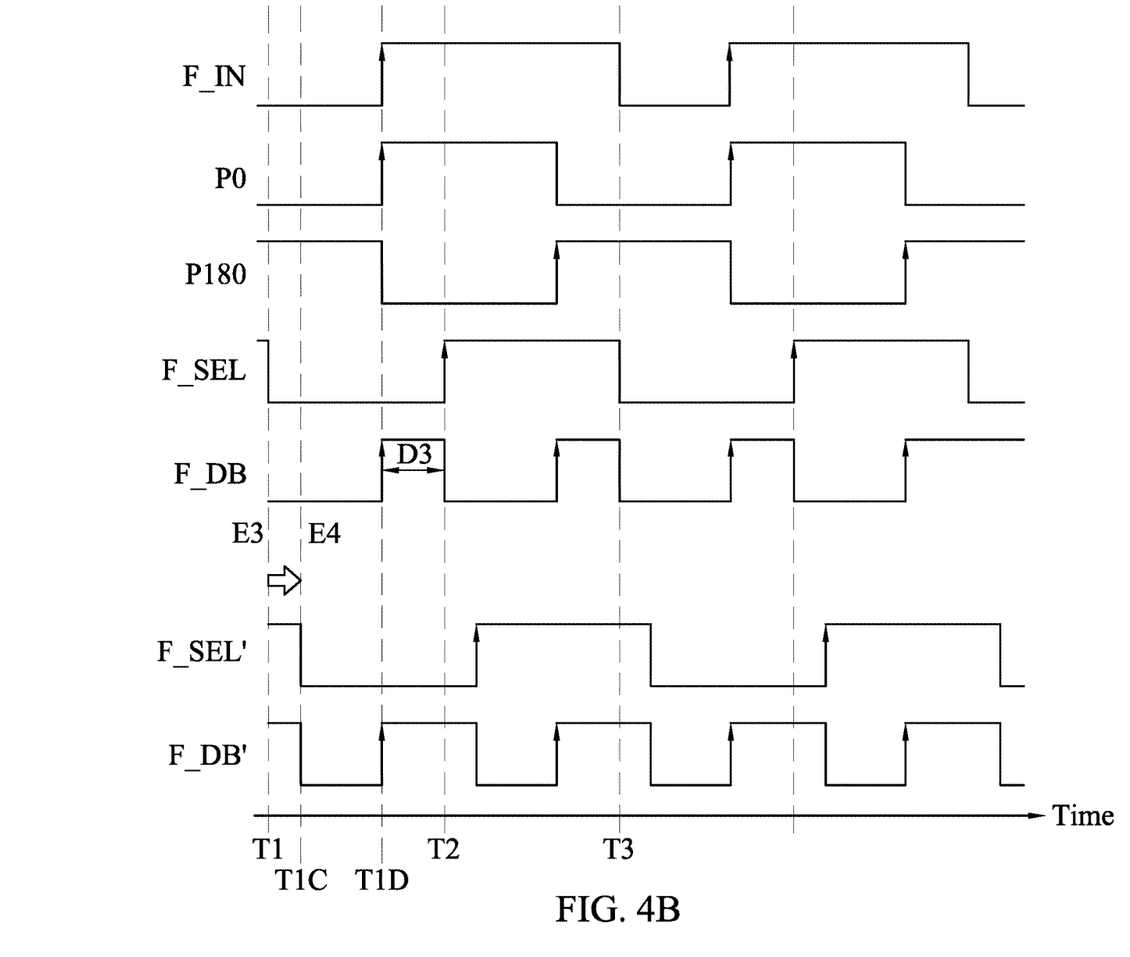
FIG. 4B is a schematic view illustrating waveforms representative of delaying an edge of a signal to adjust duty cycle, in accordance with some embodiments of the present disclosure.

FIG. 4B is a schematic view illustrating waveforms representative of delaying an edge E3 of the selection signal F_SEL to adjust duty cycle, in accordance with some embodiments of the present disclosure.

In some embodiments, the input periodic signal F_IN switches from low logic value to high logic value at time T1D, and switches from high logic value to low logic value at time T3. In some embodiments, the differential phase signals P0 and P180 are generated in according to the input periodic signal F_IN. The differential phase signals P0 and P180 have a duty cycle of around 50%. The differential phase signals P0 and P180 have opposite phases. In some embodiments, the differential phase signal P0 switches from low logic value to high logic value at time T1D, which is identical to the corresponding portion of the periodic input signal F_IN. In some embodiments, the differential phase signal P180 switches from high logic value to low logic value at time T1D, which is opposite to the corresponding portion of the periodic input signal F_IN and the differential phase signal P0.

In some embodiments, the differential phase signals P0 and P180 are extracted from the periodic input signal F_IN to generate the signal F_DB corresponding to the selection signal F_SEL. When the selection signal F_SEL is at low logic value in a duration between time T1 and time T2, the corresponding portion of the differential phase signal P0 between time T1 and time T2 is extracted to become the corresponding portion of the signal F_DB between time T1 and time T2. When the selection signal F_SEL is at high logic value in a duration between time T2 and time T3, the corresponding portion of the differential phase signal P180 between time T2 and time T3 is extracted to become the corresponding portion of the signal F_DB between time T2 and time T3. In some embodiments, the signal F_DB is created by combining or synthesizing the differential phase signals P0 and P180.

In some embodiments, as shown in FIG. 4B, the duty cycle of the signal F_DB is less than 50%. In some embodiments, the duration D3 in which the signal F_DB is at high logic value is less than half of the period D2 of the signal F_DB. The duration D3 in which the signal F_DB is at high logic value can be indicated or included by the signal F5 of FIG. 1 and FIG. 2. Furthermore, half of the period of the signal F_DB can be indicated or included by the signal F4 of FIG. 1 and FIG. 2. In some embodiments, in response to the signal F4 is greater than the signal F5 in amplitude, the selection signal is delayed or moved backward by the phase adjusting device 230 and the DCM device 260 to increase the duty cycle of the selection signal F_SEL.

In some embodiments, the edge E3 of the selection signal F_SEL, representing the transition between high logic value and low logic value, is delayed or moved backward to the edge E4 to generate another selection signal F_SEL'. In some embodiments, the selection signal F_SEL' switches from a high logic value to a low logic value at time T1C, which is later than the time T1 at which the selection signal F_SEL switches from a high logic value to a low logic value. The time T1C can be different from the time T1D. The time T1C can be earlier than the time T1D. In some embodiments, the selection signal F_SEL' switches from a high logic value to a low logic value at the edge E4, which is delayed from the edge E3 at which the selection signal F_SEL switches from a high logic value to a low logic value. In some embodiments, another signal F_DB' can be generated by combining the differential phase signals P0 and P180 corresponding to the selection signal F_SEL'. In some embodiments, the duty cycle of the signal F_DB' is greater than the duty cycle of the signal F_DB. In some embodiments, the duty cycle of the signal F_DB' is adjusted to approximately 50%.

In some embodiments, the operation of advancing the edge E1 of the selection signal F_SEL in FIG. 4A and the operation of delaying the edge E3 of the selection signal F_SEL in FIG. 4B can be performed repeatedly until the duty cycle of the signal F_DB' is substantially 50% as an output periodic signal. In some embodiments, the operation of advancing the edge E1 of the selection signal F_SEL in FIG. 4A and the operation of delaying the edge E3 of the selection signal F_SEL in FIG. 4B can be performed alternately until the duty cycle of the signal F_DB' is substantially 50% as an output periodic signal.

Figure 5:
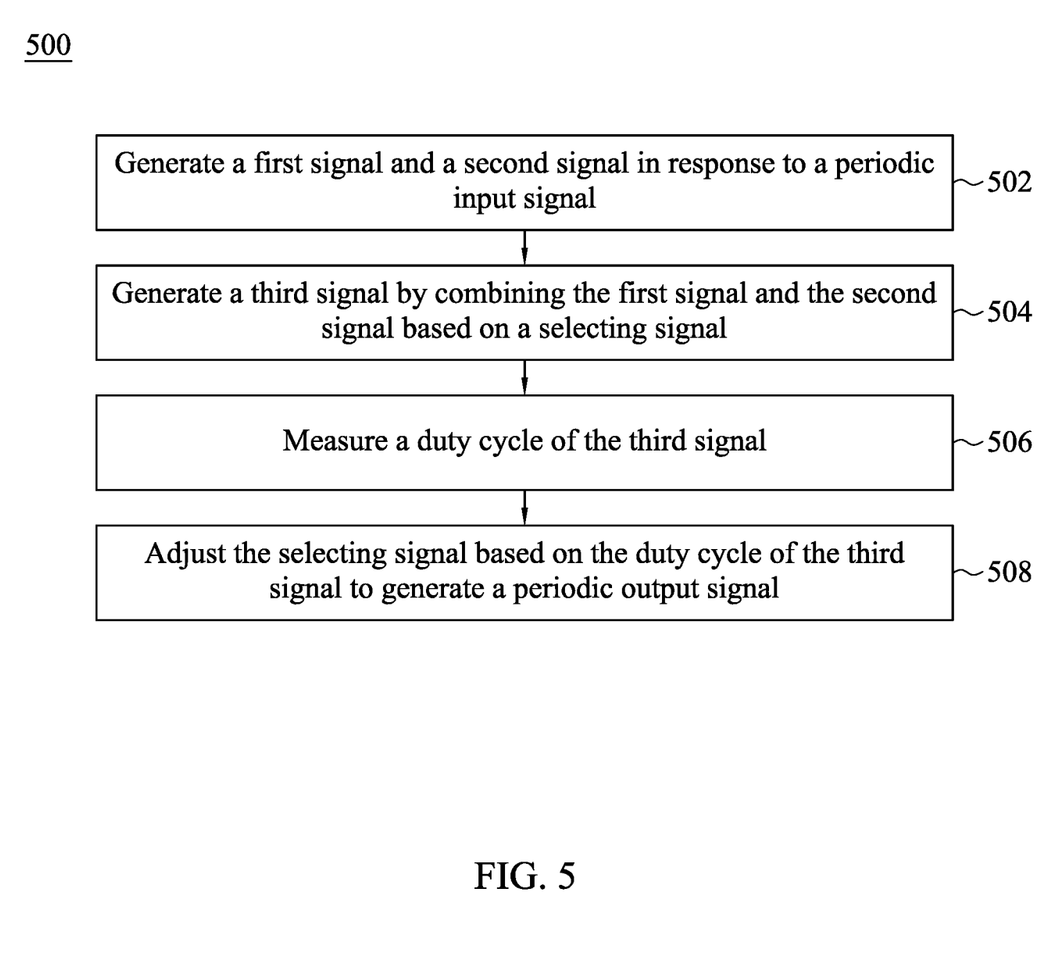
FIG. 5 is a flowchart of operations for adjusting duty cycle of a period input signal, in accordance with some embodiments of the present disclosure.

FIG. 5 is a flowchart 500 of operations for adjusting duty cycle of a period input signal, in accordance with some embodiments of the present disclosure. The flowchart 500 includes operations 502, 504, 506, and 508. In some embodiments, the flowchart 500 may include additional operations not depicted in FIG. 5. In operation 502, a first signal and a second signal are generated by the DCC device 210 in response to a periodic input signal F_IN. The first signal can correspond to the differential phase signal P0 of FIG. 1 and FIG. 2. The second signal can correspond to the differential phase signal P180 of FIG. 1 and FIG. 2.

In operation 504, the phase adjusting device 230 generates a third signal by combining the first signal and the second signal based on a selection signal F_SEL. The third signal can correspond to the signal F_DB of FIG. 1 and FIG. 2. In operation 506, a duty cycle of the third signal is measured by the DCM device 260. In operation 508, the selection signal is adjusted based on the duty cycle of the third signal to generate a periodic output signal.

Some embodiments of the present disclosure provide a circuit for adjusting a periodic input signal. The circuit includes a duty cycle calibration (DCC) device, a phase adjusting device and a duty cycle measurement (DCM) device. The DCC device is configured to generate a first signal and a second signal in response to the periodic input signal. The first signal and the second signal have different phases. The phase adjusting device is configured to receive the first signal and the second signal to generate a third signal by combining the first signal and the second signal based on a selection signal. The DCM device is configured to measure and adjust a duty cycle of the third signal so that the selection signal is adjusted to generate a periodic output signal. A frequency of the periodic output signal is twice that of the periodic input signal.

Some embodiments of the present disclosure provide a method for adjusting a periodic input signal. The method includes a DCC device generating a first signal and a second signal in response to the periodic input signal, wherein the first signal and the second signal have different phases, a phase adjusting device generating a third signal by combining the first signal and the second signal based on a selection signal, a DCM device measuring a duty cycle of the third signal and adjusting, with the phase adjusting device, the selection signal based on the duty cycle of the third signal to generate a periodic output signal, wherein a frequency of the periodic output signal is twice that of the periodic input signal.

Some embodiments of the present disclosure provide a circuit for adjusting a periodic input signal. The circuit includes a phase adjusting device and a DCM device. The phase adjusting device is configured to receive a first signal and a second signal to generate a third signal having twice of a frequency of the periodic input signal. The first signal and the second signal are extracted from the periodic input signal, and the third signal is generated by synthesizing the first signal and the second signal in accordance with a selection signal. The DCM device is configured to develop a feedback loop with the phase adjusting device. The DCM device is configured to receive the third signal and generate a fourth signal and a fifth signal based on a duty cycle of the third signal to advance or delay an edge of the third signal, which indicates a transition between a high logic value and a low logic value, until the duty cycle of the third signal is substantially 50%.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for adjusting a periodic input signal, comprising:
   a duty cycle calibration device, configured to generate a first signal and a second signal in response to the periodic input signal, wherein the first signal and the second signal have different phases;
   a phase adjusting device, configured to receive the first signal and the second signal and generate a third signal by combining the first signal and the second signal based on a selection signal; and
   a duty cycle measurement (DCM) device, configured to measure and adjust a duty cycle of the third signal so that the selection signal is adjusted to generate a periodic output signal, wherein a frequency of the periodic output signal is twice that of the periodic input signal.

2. The circuit of claim 1, wherein a first portion of the first signal is extracted to obtain the third signal when the selection signal is on a low logic value, and a second portion of the second signal is extracted to obtain the third signal when the selection signal is on a high logic value.

3. The circuit of claim 1, wherein the first signal is at a high logic value while the second signal is at a low logic value, and the first signal is at a low logic value while the second signal is at a high logic value.

4. The circuit of claim 1, wherein the DCM device is configured to generate a fourth signal and a fifth signal in accordance with the duty cycle of the third signal, wherein the fourth signal indicates half of a period of the third signal, and the fifth signal indicates a duration in which the third signal is at a high logic value.

5. The circuit of claim 4, wherein if the fourth signal is greater than the fifth signal in amplitude, the selection signal is delayed by the phase adjusting device and the DCM device to increase the duty cycle of the third signal.

6. The circuit of claim 4, wherein if the fourth signal is smaller than the fifth signal in amplitude, the selection signal is shifted by the phase adjusting device and the DCM device to decrease the duty cycle of the third signal.

7. The circuit of claim 4, wherein if the fourth signal is substantially equal to the fifth signal in amplitude, the periodic output signal is generated having the duty cycle of substantially 50%.

8. The circuit of claim 4, wherein the DCC device is configured to generate a sixth signal indicating a quarter of a period of the periodic input signal.

9. The circuit of claim 8, wherein the circuit further comprises a code generator, configured to generate a seventh signal by combining the sixth signal from the DCC device with the fourth signal and the fifth signal from the DCM device, wherein the phase adjusting device is configured to adjust the selection signal corresponding to the seventh signal.

10. The circuit of claim 9, wherein the phase adjusting device further comprises:
a multiplexer, configured to receive the first signal and the second signal and generate the third signal;
a delay chain, configured to receive the seventh signal from the code generator; and
a divider, electrically coupled between the multiplexer and the delay device.

11. A method for adjusting a periodic input signal, comprising:
generating, by a duty cycle calibration (DCC) device, a first signal and a second signal in response to the periodic input signal, wherein the first signal and the second signal have different phases;
generating, by a phase adjusting device, a third signal by combining the first signal and the second signal based on a selection signal;
measuring, by a duty cycle measurement (DCM) device, a duty cycle of the third signal; and
adjusting, by the DCM device and the phase adjusting device, the selection signal based on the duty cycle of the third signal to generate a periodic output signal, wherein a frequency of the periodic output signal is twice that of the periodic input signal.

12. The method of claim 11, further comprising:
extracting, by the phase adjusting device, a first portion of the first signal to obtain the third signal when the selection signal is on a low logic value; and
extracting, by the phase adjusting device, a second portion of the second signal to obtain the third signal when the selection signal is on a high logic value.

13. The method of claim 11, further comprising generating a fourth signal and a fifth signal based on the duty cycle of the third signal, wherein the fourth signal indicates half of a period of the third signal, and the fifth signal indicates a duration in which the third signal is at a high logic value.

14. The method of claim 13, further comprising increasing the duty cycle of the third signal by delaying the selection signal if the fourth signal is greater than the fifth signal in amplitude.

15. The method of claim 13, further comprising decreasing the duty cycle of the third signal by advancing the selection signal if the fourth signal is smaller than the fifth signal in amplitude.

16. The method of claim 13, further comprising generating the periodic output signal having the duty cycle of substantially 50% if the fourth signal is substantially equal to the fifth signal.

17. The method of claim 13, further comprising generating a sixth signal representing a quarter of a period of the periodic input signal.

18. The method of claim 17, further comprising:
generating, by a code generator, a seventh signal by combining the sixth signal, the fourth signal and the fifth signal; and
adjusting, by the phase adjusting device, the selection signal in response to the seventh signal.

19. A circuit for adjusting a periodic input signal, comprising:
a phase adjusting device, configured to receive a first signal and a second signal to generate a third signal having twice of a frequency of the periodic input signal, wherein the first signal and the second signal are extracted from the periodic input signal, and the third signal is generated by synthesizing the first signal and the second signal in accordance with a selection signal; and
a duty cycle measurement (DCM) device, configured to develop a feedback loop with the phase adjusting device, wherein:
the DCM device is configured to receive the third signal and generate a fourth signal and a fifth signal based on a duty cycle of the third signal to advance or delay an edge of the third signal, which indicates a transition between a high logic value and a low logic value, until the duty cycle of the third signal is substantially 50%.

20. The circuit of claim 19, wherein the edge of the selection signal is delayed to increase the duty cycle of the third signal if the fourth signal is greater than the fifth signal, and the edge of the selection signal is advanced to decrease the duty cycle of the third signal if the fourth signal is greater than the fifth signal.

* * * * *